(12) United States Patent
Wu et al.

(10) Patent No.: US 8,525,354 B2
(45) Date of Patent: Sep. 3, 2013

(54) BOND PAD STRUCTURE AND FABRICATING METHOD THEREOF

(75) Inventors: Hui-Min Wu, Zhubei (TW); Ming-I Wang, New Taipei (TW); Kuan-Yu Wang, New Taipei (TW); Kun-Che Hsieh, Tainan (TW); Chien-Hsin Huang, Taichung (TW)

(73) Assignee: United Microelectronics Corporation, Hsinchu (TW)

( * ) Notice: Subject to any disclaimer, the term of this patent is extended or adjusted under 35 U.S.C. 154(b) by 104 days.

(21) Appl. No.: 13/272,289

(22) Filed: Oct. 13, 2011

(65) Prior Publication Data

US 2013/0093104 A1     Apr. 18, 2013

(51) Int. Cl.
*H01L 23/48*     (2006.01)
*H01L 21/44*     (2006.01)

(52) U.S. Cl.
USPC .............. 257/786; 257/E21.536; 257/E23.02; 438/612

(58) Field of Classification Search
None
See application file for complete search history.

(56) References Cited

U.S. PATENT DOCUMENTS

| | | | |
|---|---|---|---|
| 5,136,364 A * | 8/1992 | Byrne | 257/751 |
| 5,523,595 A * | 6/1996 | Takenaka et al. | 257/295 |
| 5,573,679 A | 11/1996 | Mitchell | |
| 5,719,073 A | 2/1998 | Shaw | |
| 6,243,474 B1 | 6/2001 | Tai | |
| 6,265,328 B1 | 7/2001 | Henley | |
| 6,635,509 B1 | 10/2003 | Ouellet | |
| 6,725,719 B2 | 4/2004 | Cardarelli | |
| 6,806,593 B2 | 10/2004 | Tai | |
| 6,829,131 B1 | 12/2004 | Loeb | |
| 6,841,848 B2 | 1/2005 | MacNamara | |
| 6,872,902 B2 | 3/2005 | Cohn | |
| 6,887,391 B1 | 5/2005 | Daneman | |
| 6,936,524 B2 | 8/2005 | Zhu | |
| 6,943,448 B2 | 9/2005 | Gabriel | |
| 6,946,728 B2 | 9/2005 | Chen | |
| 7,019,955 B2 | 3/2006 | Loeb | |
| 7,045,459 B2 | 5/2006 | Freidhoff | |
| 7,049,051 B2 | 5/2006 | Gabriel | |
| 7,129,172 B2 | 10/2006 | Morrow | |
| 7,152,474 B2 | 12/2006 | Deb | |
| 7,202,101 B2 | 4/2007 | Gabriel | |
| 7,242,569 B2 | 7/2007 | Hunt | |
| 7,280,436 B2 | 10/2007 | Pedersen | |
| 7,288,424 B2 | 10/2007 | Hunter | |
| 7,329,933 B2 | 2/2008 | Zhe | |
| 7,939,932 B2 | 5/2011 | Martin | |
| 2001/0023086 A1 | 9/2001 | Park | |
| 2004/0122328 A1 | 6/2004 | Wang | |
| 2005/0014317 A1 | 1/2005 | Pyo | |
| 2005/0076719 A1 | 4/2005 | Jakobsen | |
| 2005/0162806 A1 | 7/2005 | Sarkar | |
| 2005/0194688 A1 * | 9/2005 | Gotkis et al. | 257/758 |
| 2005/0221529 A1 | 10/2005 | Bang | |
| 2006/0223329 A1 | 10/2006 | Martin | |
| 2006/0260401 A1 | 11/2006 | Xie | |

(Continued)

*Primary Examiner* — Michael Lebentritt
*Assistant Examiner* — Kevin Quinto
(74) *Attorney, Agent, or Firm* — WPAT, PC; Justin King

(57) ABSTRACT

A bond pad structure comprises an interconnection structure and an isolation layer. The dielectric layer has an opening and a metal pad. The isolation layer is disposed on the interconnection structure and extends into the opening until it is in contact with the metal pad, whereby the sidewalls of the opening is blanketed by the isolation layer, and a portion of the metal pad is exposed from the opening.

16 Claims, 4 Drawing Sheets

(56) References Cited

U.S. PATENT DOCUMENTS

| | | |
|---|---|---|
| 2007/0003082 A1 | 1/2007 | Pedersen |
| 2007/0007858 A1 | 1/2007 | Sorensen |
| 2007/0023851 A1 | 2/2007 | Hartzell |
| 2007/0040270 A1 | 2/2007 | Coenen |
| 2007/0047900 A1 | 3/2007 | Sampsell |
| 2007/0054205 A1 | 3/2007 | Lin |
| 2007/0125161 A1 | 6/2007 | Bryzek |
| 2007/0187793 A1 | 8/2007 | Moon |
| 2007/0284682 A1 | 12/2007 | Laming |
| 2008/0094686 A1 | 4/2008 | U'Ren |
| 2008/0137884 A1 | 6/2008 | Kim |
| 2008/0163687 A1 | 7/2008 | Kranz |
| 2008/0304681 A1 | 12/2008 | Langlois |
| 2009/0134459 A1 * | 5/2009 | Goto et al. .................. 257/347 |
| 2009/0180655 A1 | 7/2009 | Tien |
| 2009/0243004 A1 | 10/2009 | Lan |
| 2009/0302415 A1 | 12/2009 | Mueller |
| 2010/0002894 A1 | 1/2010 | Lan |
| 2010/0052179 A1 | 3/2010 | Lan |
| 2010/0067728 A1 | 3/2010 | Chen |
| 2010/0074458 A1 | 3/2010 | Lan |
| 2010/0084735 A1 | 4/2010 | Yang |
| 2010/0090298 A1 | 4/2010 | Shih |
| 2010/0144156 A1 | 6/2010 | Shih |
| 2010/0213568 A1 | 8/2010 | Hsu et al. |
| 2010/0270628 A1 | 10/2010 | Shih |
| 2011/0006350 A1 | 1/2011 | Shih |
| 2011/0012227 A1 | 1/2011 | Yang |
| 2011/0031624 A1 | 2/2011 | Lan |

* cited by examiner

BOND PAD STRUCTURE AND FABRICATING METHOD THEREOF

BACKGROUND OF THE INVENTION

1. Field of Invention

The present invention relates to a semiconductor device and the fabricating method thereof and more particularly relates to a bond pad structure and the fabricating method thereof.

2. Description of Related Art

Along with the improvement of the electrical technology, providing consumers a consumer electronic product with smaller size and more functions is continuously required. To satisfy the requirement, micro-electro-mechanical systems (MEMS) device, such as a micro-acoustical sensor, a gyro-sensor, an accelerometer or a clock generation and oscillator are consequently involved in the consumer electronic products.

A typical MEMS device is formed by a semiconductor process, wherein a plurality of micro-electromechanical elements are directly minimized and formed on a wafer, so as to be integrated with a circuit used for receiving, treating or transmitting signals resulted form the micro-electromechanical elements by at least one bond pads or bonding wires. Next, the plurality of the MEMS devices formed on the wafer should be divided by a die sawing process.

Because both of the MEMS devices and the bond pads of these micro-electromechanical elements generally need to be exposed form the wafer surface via an opening, thus undercuts may occur on the sidewalls of the openings used to expose the bond pad of these micro-electromechanical elements due to the etching process subsequently performed to form the openings for exposing the MEMS devices. Accordingly, the bond pads may be damage by the impact of the die sawing process or the subsequent manufacturing procedurals, and at the worst case, material peeling may even occur.

Therefore, how to avoid the bond pad structure from damage due to the impacts of the subsequent manufacturing procedurals is still a challenge to the art.

SUMMARY OF THE INVENTION

According to one aspect of the present invention, a bond pad structure is provided, wherein the bond pad structure comprises an interconnection structure and an isolation layer. The interconnection structure has at least one opening and at least one metal pad. The isolation layer is disposed on the interconnection structure and extends into the opening until in contact with the metal pad, whereby the sidewalls of the opening is blanketed by the isolation layer, and a portion of the metal pad is exposed from the opening.

In one embodiment of the present invention, the isolation layer is made of a material selected from a group consisting of aluminum oxide ($Al_2O_3$), silicon nitride (SiN), silicon carbonitride (SiCN), amorphous silicon, organic polymer and the arbitrary combinations thereof. In one embodiment of the present invention, the isolation layer has a bending angle formed on the corner where the sidewalls of the opening adjoin to the metal pad.

In one embodiment of the present invention, the interconnection structure comprises an inter-layer dielectric (ILD) and a passivation layer, wherein the ILD is used to carry the metal pad, the passivation layer is disposed on the ILD, and the opening penetrates through the passivation layer to expose a portion of the metal pad.

In one embodiment of the present invention, the bond pad structure further comprises a hard mask layer formed on the isolation layer without in contact with the metal pad. In one embodiment of the present invention, the hard mask layer is an aluminum layer. In one embodiment of the present invention, the bond pad structure further comprises a silicon oxide layer embedded between the hard mask layer and the isolation layer. In one embodiment of the present invention, the bond pad structure further comprises a metal oxide layer formed on the surface of the metal pad and disposed at the same side of the opening but not being exposed from the opening.

According to another aspect of the present invention, a MEMS device is provided, wherein the MEMS device comprises a substrate, a transistor, a micro-electromechanical element and a bond pad structure, wherein the transistor, the micro-electromechanical element and the bond pad structure are formed on the substrate. The bond pad structure comprises an interconnection structure and an isolation layer. The interconnection structure is formed on the substrate and has at least one opening and at least one metal pad. The metal pad disposed in the dielectric layer is electrically connected to the transistor and the micro-electromechanical element. The isolation layer is disposed on the dielectric layer and extends into the opening until in contact with the metal pad, whereby the sidewalls of the opening is blanketed by the isolation layer, and a portion of the metal pad is exposed from the opening.

In one embodiment of the present invention, the MEMS device further comprises a hard mask layer formed on the isolation layer without in contact with the metal pad. In one embodiment of the present invention, the isolation layer has a bending angle formed on a corner where the sidewalls of the opening adjoin to the metal pad. In one embodiment of the present invention, the MEMS device further comprises a silicon oxide layer embedded between the hard mask layer and the isolation layer. In one embodiment of the present invention, the MEMS device further comprises a metal oxide layer formed on the surface of the metal pad and disposed at the same side of the opening but not being exposed from the opening.

According to further another aspect of the present invention, a method for fabricating a bond pad structure is provided, wherein the method comprises steps as follows: An interconnection structure including an ILD and at least one metal pad is firstly provided. An opening is then formed on the ILD, so as to expose a portion of the metal pad. An isolation layer is subsequently formed on the ILD to cover the sidewalls of the opening and the exposed metal pad. Next, the isolation layer is patterned to expose a portion of the metal pad from the opening.

In some embodiments of the present invention, the formation of the interconnection structure comprises the following steps: Firstly, a substrate is provided, and then pluralities of patterned metal layers and an ILD used to isolate the patterned metal layers are formed on the substrate. A passivation layer is subsequently formed over the patterned metal layers and the ILD.

In some embodiments of the present invention, the method further comprises steps of forming at least one transistor and a portion of a micro-electromechanical element, prior to the formation of the interconnection structure.

In some embodiments of the present invention, the method further comprises steps of forming a metal oxide layer on the metal pad, before the passivation layer is formed.

In one embodiment of the present invention, the isolation layer is made of a material selected from a group consisting of Al$_2$O$_3$, SiN, SiCN, amorphous silicon, organic polymer and the arbitrary combinations thereof.

In some embodiments of the present invention, the method further comprises steps of forming a hard mask layer on the isolation layer without in contact with the metal pad.

In some embodiments of the present invention, the method further comprises steps of forming a silicon oxide layer on the isolation layer without beyond the opening prior to the formation of the hard mask.

According to aforementioned embodiment of the present invention, a bond pad structure and the method for fabricating thereof are provided. Wherein an opening is defined on an interconnection structure to expose a portion of a metal pad. An isolation layer is then formed to cover the sidewalls of the opening and the exposed metal pad. The isolation layer is subsequently patterned to exposed the metal pad from the opening again, whereby the sidewalls of the opening are thoroughly covered by the patterned isolation layer.

Because, the isolation layer has better etching resistance in comparison with the ILD layer of the interconnection structure, when the sidewalls of the opening are thoroughly covered by the isolation layer, it is more likely to prevent undercuts occurring in the interconnection structure and avoid the bond pad structure from being damaged due to the impacts of the subsequent manufacturing procedurals. Besides, since facilitating the bond pad structure can reduce the use of reticles in the subsequent manufacturing procedurals, thus the fabrication process can be simplified, the manufacturing cost should be significantly reduced and the objects of the present invention can be reached.

In order to make the aforementioned and other objects, features and advantages of the present invention comprehensible, preferred embodiments accompanied with figures are described in detail below. The isolation layer is subsequently patterned so as to expose the portion of the metal pad form the opening again.

BRIEF DESCRIPTION OF THE DRAWINGS

The objects and advantages of the present invention will become more readily apparent to those ordinarily skilled in the art after reviewing the following detailed description and accompanying drawings, in which:

FIGS. 1C' to 1E' are cross sectional views illustrating a portion of the process for manufacturing a MEMS device, in accordance with another embodiment of the present invention.

DESCRIPTION OF EMBODIMENTS

Figure 1A:
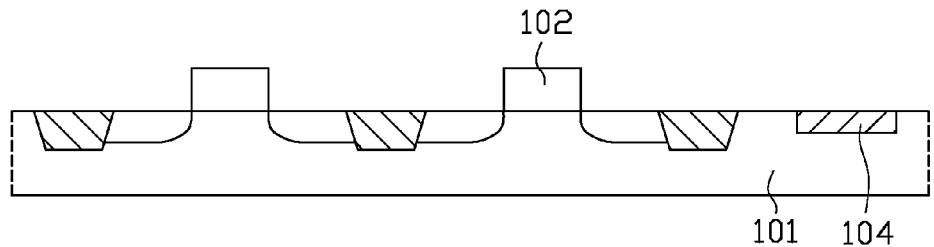
FIGS. 1A to 1E are cross sectional views illustrating the process for manufacturing a MEMS device, in accordance with one embodiment of the present invention.

Detail descriptions of several embodiments eligible to exemplify the features of making and using the present invention are disclosed as follows. It must be appreciated that the following embodiments are just exemplary, but not being used to limit the scope of the present invention. Wherever possible, the same reference numbers are used in the drawings and the description to refer to the same or like parts.

FIGS. 1A to 1E are cross sectional views illustrating the process for manufacturing a MEMS device 100, in accordance with one embodiment of the present invention. In some embodiments of the present invention, the MEMS device 100 may be a micro-acoustical sensor, a gyro-sensor, an accelerometer or a clock generation and oscillator.

The process for fabricating the MEMS device 100 comprises steps as follows: Firstly, a substrate 101 having at least one micro-electromechanical element 104 and an electrical device used for receiving, dealing with or transmitting signals generated by the micro-electromechanical element 104 is provided (see FIG. 1A). For example, in the present embodiment, the substrate 101 is a silicon substrate and preferably is a silicon wafer. The electrical device formed on the substrate 101 comprises at least one complementary metal-oxide-semiconductor (CMOS) transistor 102.

Figure 1B:
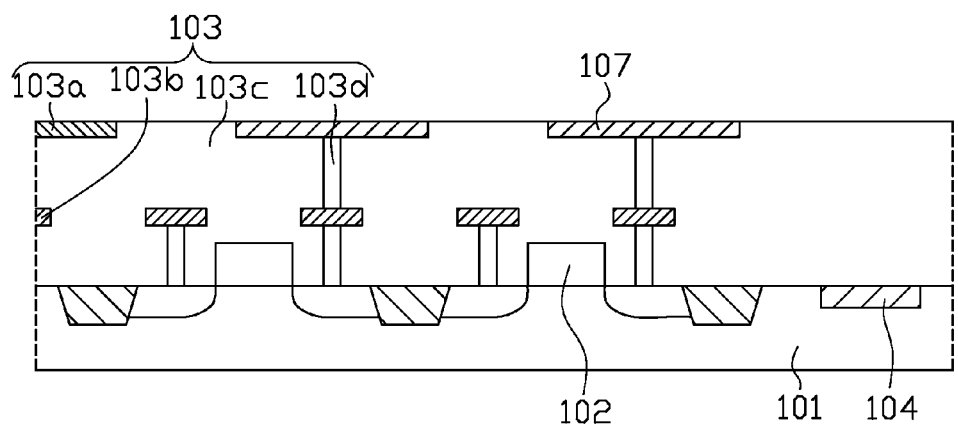
Figure 1C:
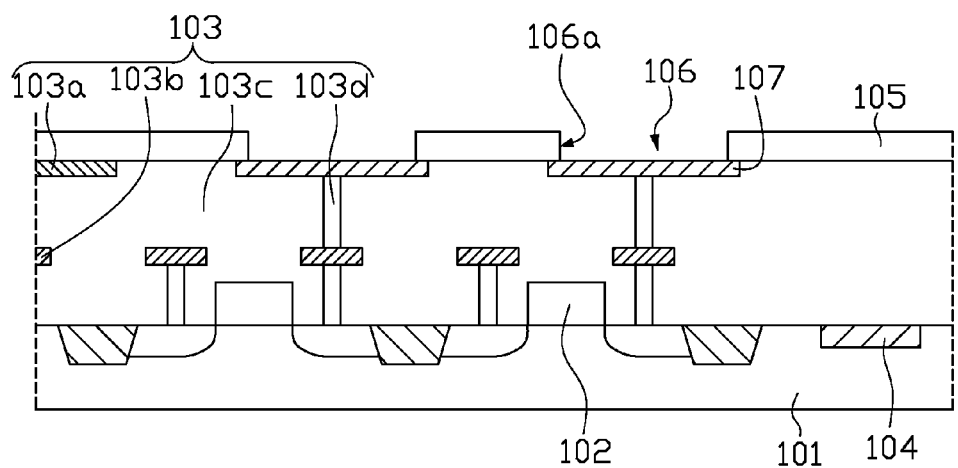
Figure 1C:
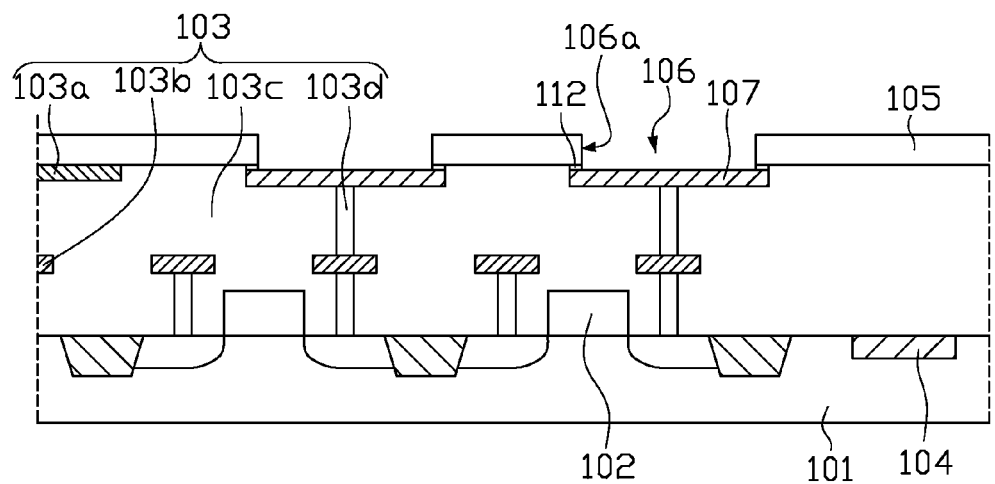

Subsequently, an interconnection structure 103 is formed on the substrate 101 and the CMOS 102 (see FIG. 1B). The interconnection structure 103 comprises a plurality of stacked metal layers, such as the patterned metal layers 103a and 103b, an ILD 103c and at least one via contact 103d, wherein the ILD 103c is used to isolate the patterned metal layers 103a and 103b, and the via contact 103d is used to electrically connect the patterned metal layers 103a and 103b.

In some embodiments of the present invention, the patterned metal layers 103a and 103b preferably are constituted by a plurality of pattered aluminum layers used to electrically connect to the micro-electromechanical element 104 and the CMOS transistor 102, wherein a portion of the top patterned metal layers 103a may serve as a metal pad (thereafter referred as metal pad 107, for purpose of clearly description) used to be electrically connected to an external device via a bonding wire or a solder ball (not shown).

Next, a passivation layer 105 is formed to cover the ILD 103c and the metal pad 107. The passivation layer 105 preferably is made of silicon nitride. An etching process is then performed to remove a portion of the passivation layer 105, whereby an opening 106 is formed in the passivation layer 105 so as to expose a portion of the metal pad 107 (see FIG. 1C).

It is worthy to note that, in some other embodiment (referring to FIG. 1C'), an Al$_2$O$_3$ thin film may be formed on the metal pad 107 by a deposition process or a thermal process (such as a thermal oxidation process), prior to the formation of the passivation layer 105. And a portion of the Al$_2$O$_3$ thin film can be removed by the aforementioned etching process to form a patterned metal oxide layer 112 after the passivation layer 105 is formed. In other words, the patterned metal oxide layer 112 is formed on a surface of the metal pad 107 and disposed at the same side of the opening 106 but not being exposed from the opening 106.

Figure 1D:
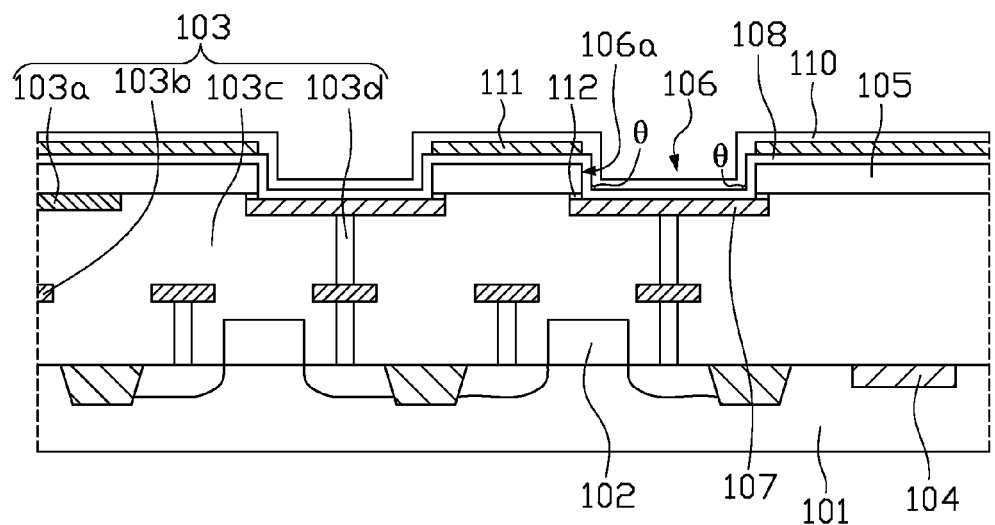
Figure 1D:
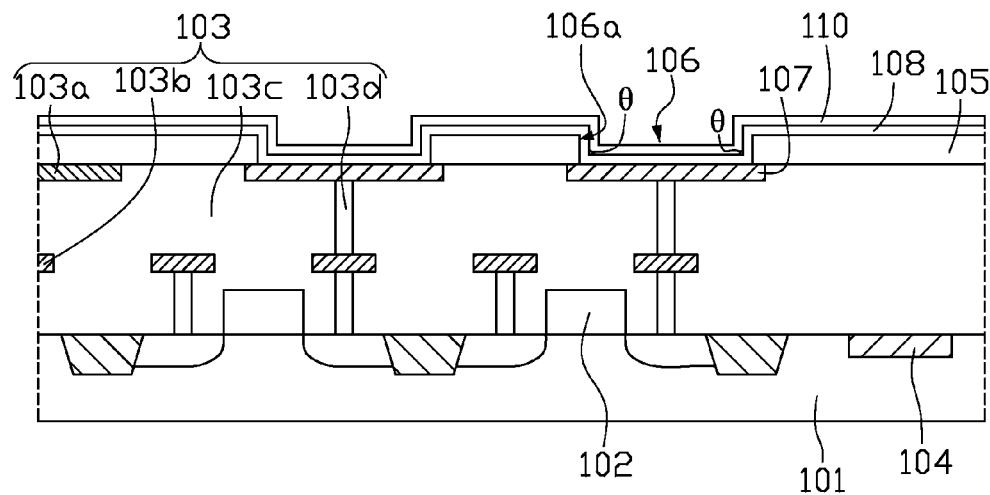

After the etching process is carried out, an isolation layer 108 and a hard mask layer 110 are sequentially formed on the passivation layer 105 and the exposed portion of the metal pad 107. As shown in FIG. 1D, the portion of the isolation layer 108 extending into the opening 106 blankets over the sidewalls 106a of the opening 106 and bends to form a bending angle θ on the corner where the sidewalls 106a of the opening 106 adjoin the metal pad 107.

In some embodiments of the present invention, the preferred material used to form the isolation layer 108 may be selected from a group consisting of Al$_2$O$_3$, SiN, SiCN, amorphous silicon, organic polymer and the arbitrary combinations thereof. The isolation layer 108 may be a single layer or multiple stacked layers formed by depositing Al$_2$O$_3$, SiN, SiCN or amorphous silicon on the passivation layer 105 and the exposed portion of the metal pad 107 or formed by a spin coating process to separate organic polymer thereon. The hard mask layer 110 preferably may be an aluminum layer.

A second etching process is subsequently performed to remove portions of the hard mask layer 110 and the isolation layer 108, such that a portion of the metal pad can be exposed from the opening 106 again. Wherein, the pattern hard mask layer 110 is not in contact with the metal pad 107 directly.

Figure 1E:
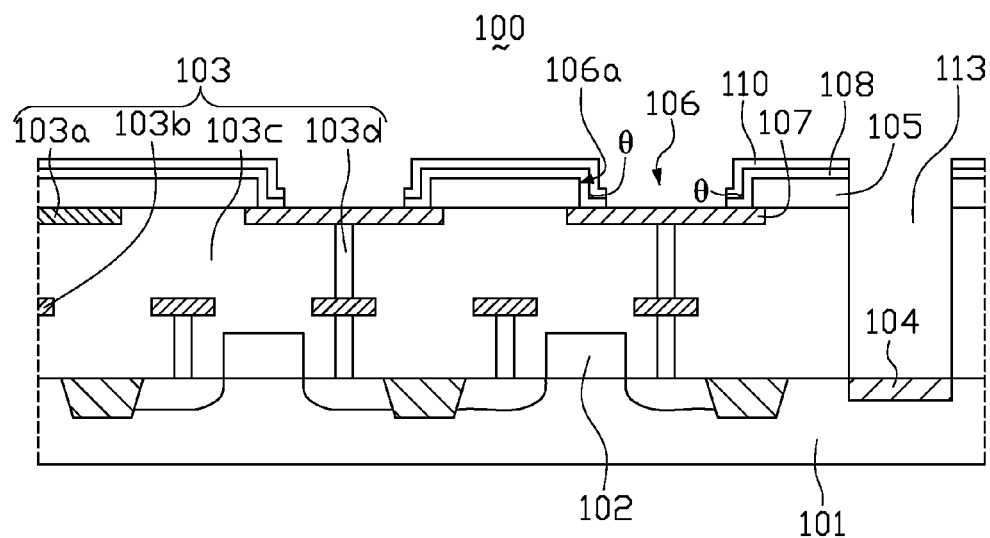
Figure 1E:
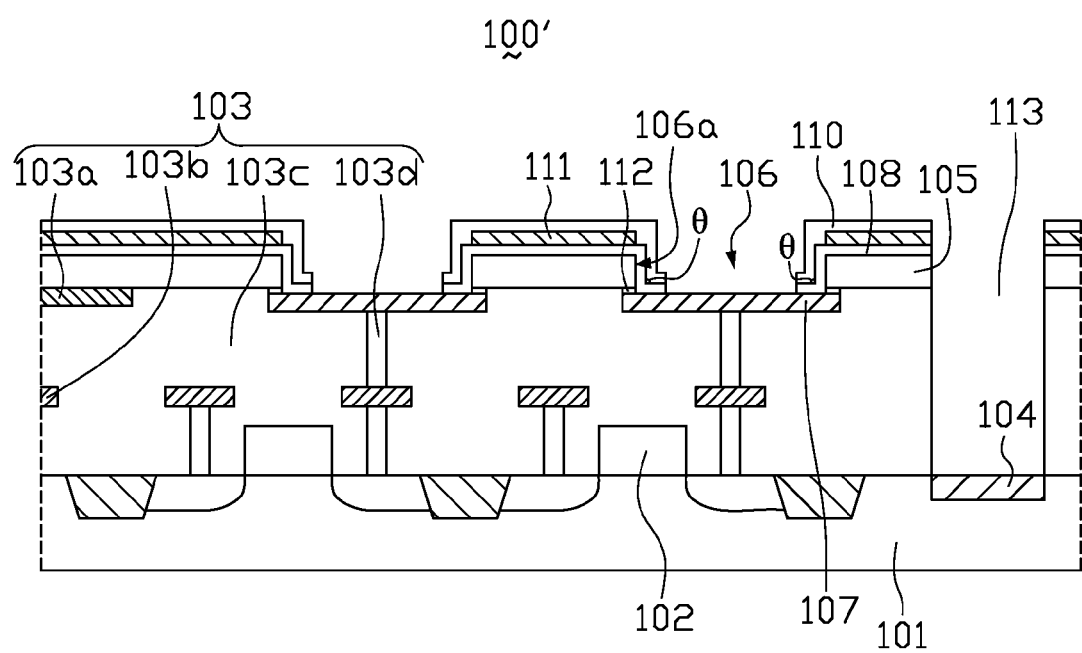

After the second etching process is carried out, at least one etching process, such as an anisotropy etching process, is performed to form a MEMS opening 113 in the ILD 103c, whereby the micro-electromechanical element 104 is exposed, and meanwhile the MEMS device 100 shown in FIG. 1E can be formed.

However, to improve the insulation of the isolation layer 108, in some other embodiment (continued from FIG. 1C'), a patterned silicon oxide layer 111 may be provided to embedded between the isolation layer 108 and the hard mask layer 110. The formation of the patterned silicon oxide layer 111 comprises steps as follows: A silicon oxide layer 111 is firstly formed on the isolation layer 108 prior to the formation of the hard mask layer 110 (see FIG. 1D'). A pattern process is then performed to pattern the silicon oxide layer 111 and make the patterned silicon oxide layer 111 without extending beyond the opening 106. The hard mask layer 110 is subsequently formed on the isolation layer 108, the exposed metal pad 107 and the patterned silicon oxide layer 111. Therefore, after the second etching process is carried out, the pattered silicon oxide layer 111 can be still thoroughly wrapped by the isolation layer 108 and the hard mask layer 110.

Subsequently, at least one etching process is performed to form a MEMS opening 113 in the ILD 103c, whereby the micro-electromechanical element 104 is exposed, and meanwhile the MEMS device 100' shown in FIG. 1E' is completed.

In the present embodiment, the MEMS device 100' comprises an electrical device (the CMOS transistor 102), a micro-electromechanical element 104 and a bond pad structure. The bond pad structure comprises an interconnection structure 103 (at least comprising an ILD 103c, a metal pad 107 and a passivation layer 105), a patterned silicon oxide layer 111, a metal oxide layer 112, an isolation layer 108 and a hard mask layer 110. Wherein, the interconnection structure 103 has an opening 106. The metal pad 107 disposed in the dielectric layer is electrically connect to the CMOS transistor 102 and the micro-electromechanical element 104. The isolation layer 108 is disposed on the dielectric layer and extends into the opening 106 to cover the sidewalls 106a of the opening 106 until in contact with the metal pad 107, whereby a portion of the metal pad 107 can be exposed from the opening 106. The hard mask layer 110 is disposed on the isolation layer 108 without in contact to the metal pad 107. The patterned silicon oxide layer 111 is embedded between the isolation layer 108 and the hard mask layer 110. The metal oxide layer 112 is disposed on the surface of the metal pad 107 and disposed at the same side of the opening 106 but not being exposed from the opening 106.

Since, the isolation layer 108 and the hard mask layer 110 have an insulativity substantially the same as that of the ILD 103c and have a better resistance against etching reagents, such as hydrofluoric acid (HF), in comparison with the ILD 103c, thus the sidewalls 106a of the opening 106 which are thoroughly covered by the isolation layer 108 and the hard mask layer 110 can be prevented from being damaged by the second etching process. Therefore, the impact of the die sawing process or the subsequent manufacturing procedurals may not conversely affect the bond pad structure to cause material peeling.

Furthermore, because it is not necessary to form any addition isolation structure, such as an isolation ring, on the peripheral area of the bond pad structure, thus facilitating the present bond pad structure can reduce the use of reticles in the subsequent manufacturing procedurals. Accordingly, the manufacturing process of the bond pad structures provide by the aforementioned embodiments can be simplified and the manufacturing cost can be reduced.

According to aforementioned embodiment of the present invention, a bond pad structure and the method for fabricating thereof are provided. Wherein an opening is defined on an interconnection structure to expose a portion of a metal pad. An isolation layer is then formed to cover the sidewalls of the opening and the exposed metal pad. The isolation layer is subsequently patterned to exposed the metal pad from the opening again, whereby the sidewalls of the opening are thoroughly covered by the patterned isolation layer.

Because, the isolation layer has better etching resistance in comparison with the ILD layer of the interconnection structure, when the sidewalls of the opening are thoroughly covered by the isolation layer, it is more likely to prevent undercut occurring in interconnection structure and avoid the bond pad structure from being damaged due to the impacts of the subsequent manufacturing procedurals. Besides, since facilitating the bond pad structure can reduce the use of reticles in the subsequent manufacturing procedurals, thus the fabrication process can be simplified, the manufacturing cost should be significantly reduced and the objects of the present invention can be reached.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A bond pad structure, comprising:
   an interconnection structure, having an opening and a metal pad;
   a metal oxide layer formed on a surface of the metal pad and disposed at the same side of the opening but not being exposed from the opening; and
   an isolation layer, disposed on the interconnection structure and extending into the opening until in contact with the metal pad, whereby sidewalls of the opening are blanketed by the isolation layer, and a portion of the metal pad is exposed from the opening.

2. The bond pad structure of claim 1, wherein the isolation layer is made of a material selected from a group consisting of aluminum oxide ($Al_2O_3$), silicon nitride (SiN), silicon carbonitride (SiCN), amorphous silicon, organic polymer and the arbitrary combinations thereof.

3. The bond pad structure of claim 1, wherein the interconnection structure comprises:
   an inter-layer dielectric (ILD), used to carry the metal pad; and
   a passivation layer, disposed on the ILD, wherein the opening penetrates through the passivation layer to expose a portion of the metal pad.

4. The bond pad structure of claim 1, further comprising a silicon oxide layer embedded between the hard mask layer and the isolation layer.

5. The bond pad structure of claim 1, wherein the isolation layer has a bending angle formed on the corner where the sidewalls of the opening adjoins to the metal pad.

6. The bond pad structure of claim 1, further comprising a hard mask layer disposed on the isolation layer without in contact with the metal pad.

7. The bond pad structure of claim 6, wherein the hard mask layer is an aluminum layer.

8. A micro-electro-mechanical systems (MEMS) device, comprising:
   a substrate;

a transistor, formed on the substrate;

a micro-electromechanical element, formed on the substrate; and a bond pad structure, comprising:

an interconnection structure, formed on the substrate and having an opening and a metal pad electrically connected to the transistor and the micro-electromechanical element;

a metal oxide layer formed on the surface of the metal pad and disposed at the same side of the opening but not being exposed from the opening; and an isolation layer disposed on the interconnection structure and extending into the opening until in contact with the metal pad, whereby the sidewalls of the opening are blanketed by the isolation layer, and a portion of the metal pad is exposed from the opening.

9. The MEMS device of claim 8, further comprising a hard mask layer formed on the isolation layer without in contact with the metal pad.

10. The MEMS device of claim 8, wherein the isolation layer has a bending angle formed on a corner where the sidewalls of the opening adjoin the metal pad.

11. The MEMS device of claim 8, further comprising a silicon oxide layer embedded between the hard mask layer and the isolation layer.

12. A method for fabricating a bond pad structure, comprising:

providing a substrate;

forming pluralities of patterned metal layers;

forming an inter-layer dielectric (ILD) to isolate the patterned metal layers on the substrate, so as to form at least one metal pad;

forming a metal oxide layer on the metal pad;

forming a passivation layer over the patterned metal layers and the ILD;

forming an opening in the passivation layer so as to expose a portion of the metal pad;

forming an isolation layer on the passivation layer to cover the sidewalls of the opening and the exposed metal pad; and patterning the isolation layer to expose a portion of the metal pad from the opening.

13. The method of claim 12, further comprising steps of forming at least one transistor and a micro-electromechanical element prior to the formation of the interconnection structure.

14. The method of claim 12, wherein the isolation layer is made of a material selected from a group consisting of $Al_2O_3$, SiN, SiCN, amorphous silicon, organic polymer and the arbitrary combinations thereof.

15. The method of claim 12, further comprising steps of forming a hard mask layer on the isolation layer without in contact with the metal pad.

16. The method of claim 15, further comprising steps of:

forming a silicon oxide layer on the isolation layer prior to the formation of the hard mask; and patterning the silicon oxide layer to make the patterned silicon oxide layer without beyond the opening.

* * * * *